(12) United States Patent
Bender et al.

(10) Patent No.: US 9,343,688 B2
(45) Date of Patent: May 17, 2016

(54) SEMICONDUCTOR POLYMERS

(71) Applicant: Saudi Basic Industries Corporation, Riyadh (SA)

(72) Inventors: Timothy P. Bender, Toronto (CA); Benoît H. Lessard, Toronto (CA)

(73) Assignee: Saudi Basic Industries Corporation, Riyadh (SA)

( * ) Notice: Subject to any disclaimer, the term of this patent is extended or adjusted under 35 U.S.C. 154(b) by 0 days.

(21) Appl. No.: 14/199,380

(22) Filed: Mar. 6, 2014

(65) Prior Publication Data

US 2014/0272158 A1    Sep. 18, 2014

Related U.S. Application Data

(60) Provisional application No. 61/777,452, filed on Mar. 12, 2013.

(51) Int. Cl.
| | |
|---|---|
| *C08G 61/12* | (2006.01) |
| *H01L 51/00* | (2006.01) |
| *C09B 69/10* | (2006.01) |
| *H01B 1/00* | (2006.01) |
| *H01L 51/42* | (2006.01) |

(52) U.S. Cl.
CPC .......... *H01L 51/0078* (2013.01); *C09B 69/108* (2013.01); *H01L 51/009* (2013.01); *H01L51/0036* (2013.01); *H01L 51/0094* (2013.01); *H01L 51/4253* (2013.01); *Y02E 10/549* (2013.01)

(58) Field of Classification Search
CPC ....................................................... C08G 61/12
USPC .......... 528/423, 166, 205; 427/387; 252/501.1
See application file for complete search history.

(56) References Cited

U.S. PATENT DOCUMENTS

| | | | |
|---|---|---|---|
| 4,622,170 A | 11/1986 | Wynne et al. | 252/519.21 |
| 4,839,112 A | 6/1989 | Wynne et al. | 264/435 |
| 2012/0226042 A1 | 9/2012 | Reichelt et al. | 546/13 |
| 2012/0248878 A1 | 10/2012 | Iwanaga et al. | 307/80 |

OTHER PUBLICATIONS

International Search Report issued in PCT/IB2014/001021 dated Nov. 11, 2014.

*Primary Examiner* — Duc Truong
(74) *Attorney, Agent, or Firm* — Norton Rose Fulbright US LLP

(57) ABSTRACT

Disclosed is a semiconductor polymer having the following structure:

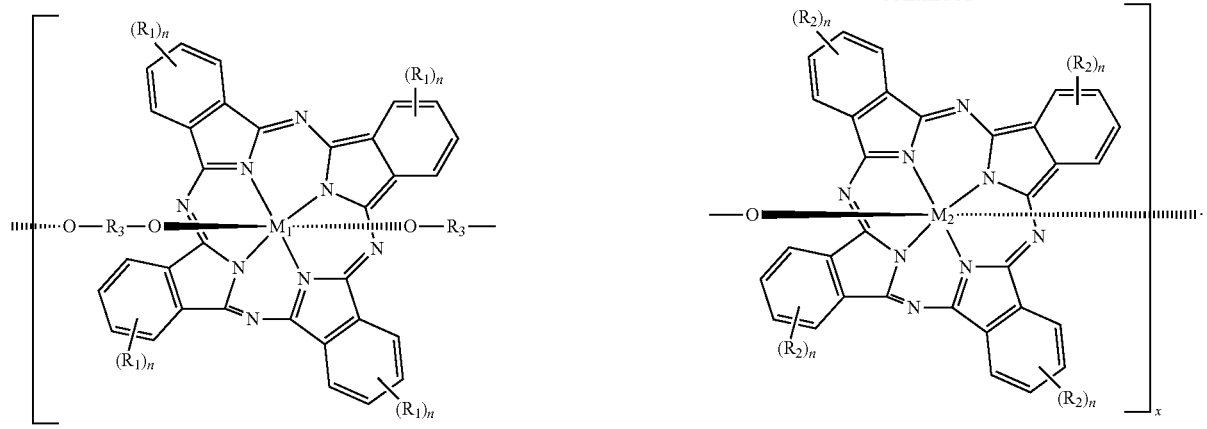
30 Claims, 1 Drawing Sheet

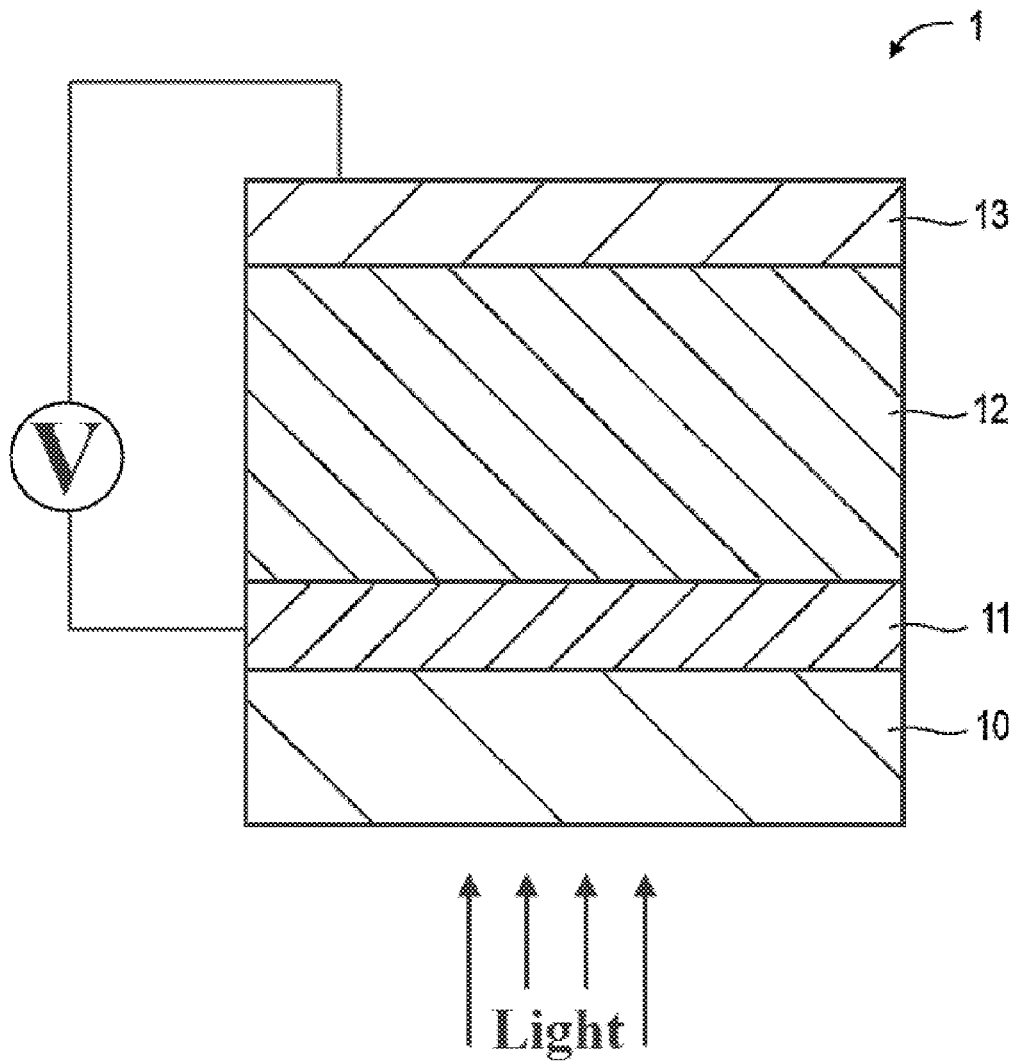

SEMICONDUCTOR POLYMERS

CROSS REFERENCE TO RELATED APPLICATIONS

This application claims the benefit of U.S. Provisional Application No. 61/777,452, filed Mar. 12, 2013. The contents of the referenced application(s) are incorporated into the present application by reference.

BACKGROUND OF THE INVENTION

A. Field of the Invention

The invention generally concerns the use of semi-conductive polymers that can be used in organic photovoltaic cells.

B. Description of Related Art

Rising energy prices and concerns relating to global warming from burning fossil fuels has led to a search for more cost effective and efficient renewable energy sources. One such source of renewable energy that has been identified is solar energy. The problems associated with converting solar energy into electricity has been, in large part due to the inefficiencies of the energy conversion process. For instance, photovoltaic cells (e.g., solar cells) have been developed that can convert solar energy into usable energy, but the costs associated with doing so have hindered the widespread application of this technology into the marketplace.

In recent years research relating to the use of polymers in the photoactive layers of organic photovoltaic cells has increased. One of the unique aspects of using polymers is that they allow organic electronic devices to be manufactured by cost-effective solution-processing techniques such as spin casting, dip coating or ink jet printing. Solution processing can be carried out cheaper and on a larger scale compared to the evaporative techniques used to make inorganic thin film devices, which rely on vacuum deposition techniques. Many of the polymers that are currently being used suffer from low charge carrier mobility (electrical conduction) and are complicated to synthesize, which increases the ultimate costs of production.

SUMMARY OF THE INVENTION

It has been discovered that polymers made from phthalocyanines (nPcs) containing group IV metals have semi-conductive properties and can be used in the photoactive layer of an organic photovoltaic cell. The group IV metal (i.e., silicon, germanium, and tin) containing Pcs include at least two axial bonds that can be coupled to bifunctional spacers. This results in building blocks that can be used to form the polymers of the present invention (e.g., though a condensation reaction).

In at least one aspect of the present invention there is disclosed a polymer that can be used in a photoactive layer in an organic photovoltaic cell having a structure of:

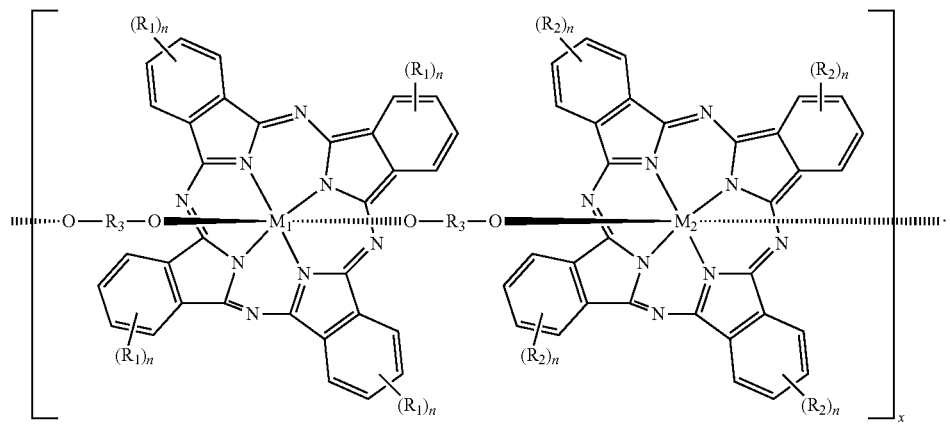

$M_1$ and $M_2$ can each independently be silicon, germanium, or tin. In certain instances, $M_1$ and $M_2$ are both silicon or both germanium or both tin. In other instances, $M_1$ and $M_2$ can be different (e.g., the combination could be Si and Ge, Si and Sn, or Ge and Sn). $(R_1)_n$ and $(R_2)_n$ can each independently be a hydrocarbon, a hydrogen, or a halogen. n can be an integer from 1 to 4. The hydrocarbon can be a substituted or un-substitued hydrocarbon. The hydrocarbon can be a substituted or un-substituted methyl, ethyl, propyl, isopropyl, n-butyl, sec-butyl or tert-butyl group. The halogen can be fluorine, chlorine, bromine, or iodine. $R_3$ can be an aryl group or a carbonate group or polymers of such groups. Non-limiting examples of such groups are provided in the detailed description section and are incorporated into this section by reference. x can vary as needed, and can be an integer from 1 to 10000, 1 to 1000, 1 to 500, 1 to 100, 1 to 50, 1 to 25, or 1 to 15. In an even further embodiment, the polymer can have the following structure:

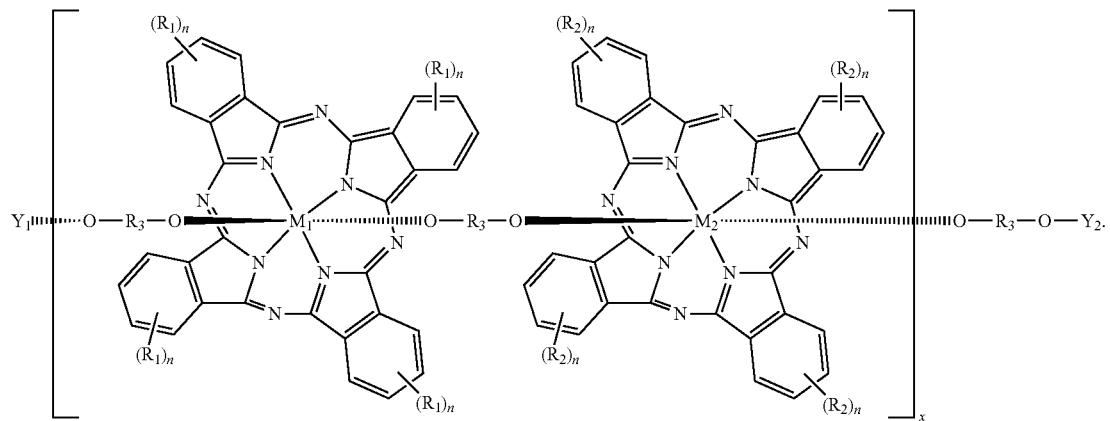
$Y_1$ and $Y_2$ can each independently be:
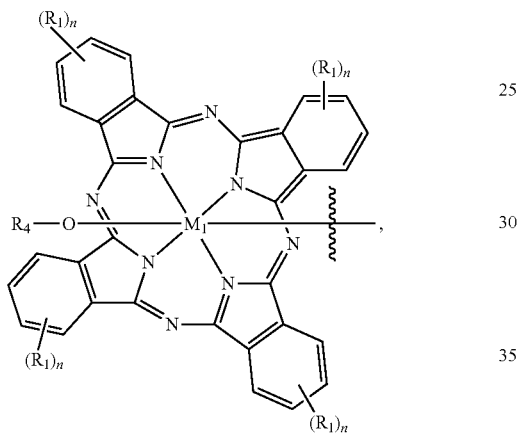
and
$R_4$ can be an aryl group such as those disclosed above and throughout this specification. In particular, instances, the $R_4$ aryl group can include includes 6 to 22 carbon atoms, or 6 to 18 carbon atoms, or 6 to 10 carbon atoms. In one non-limiting aspect, the polymer can be the reaction product of:
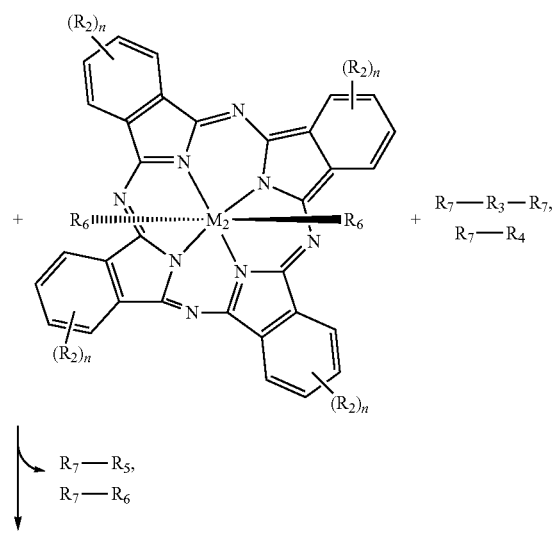

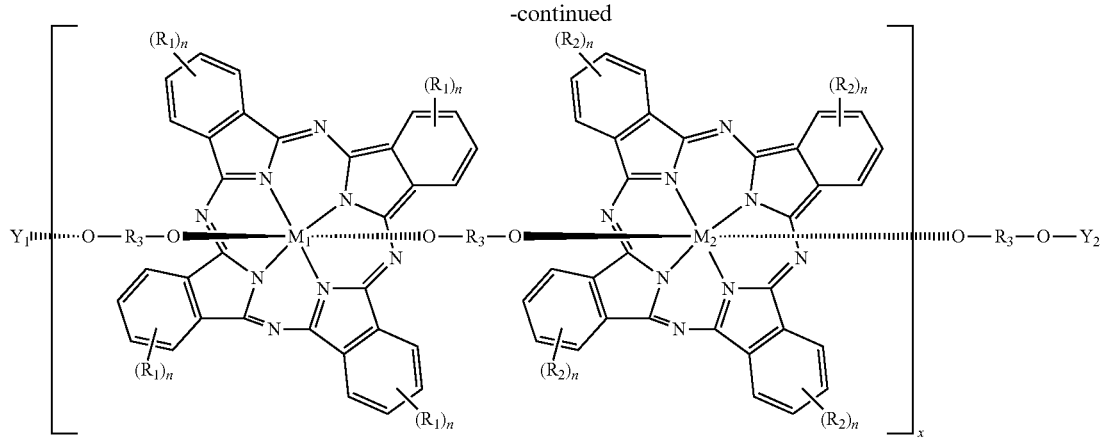

wherein, $R_5$, $R_6$, and $R_7$ can each independently a halogen or a hydroxyl group. In a particular instance, $M_1$ and $M_2$ can each be each silicon, $R_1$ and $R_2$ can each be H and n is 1, $R_3$ can be $C_6H_4$, $R_4$ can be $C_6H_5$, and $R_5$ and $R_6$, can each be a hydroxyl group, and $R_7$ can be Cl. In other particular instance, $M_1$ and $M_2$ can each be germanium, $R_1$ and $R_2$ can each be H and n is 1, $R_3$ can be $C_6H_4$, $R_4$ can be $C_6H_5$, $R_5$ and $R_6$ can each be a hydroxyl group, and $R_7$ can be a hydroxyl group. Further the polymers can be modified with a dopant so as to enhance their p-type or n-type properties.

Also disclosed is an organic photovoltaic cell that includes a photoactive layer or layers. The photoactive layer or layers can include any one of the polymers of the present invention. The photovoltaic cell can include a transparent or translucent substrate, a transparent or translucent electrode, the photoactive layer or layers, and a second electrode, wherein the photoactive layer or layer is disposed between the transparent/translucent electrode and the second electrode. The transparent/translucent electrode can be a cathode and the second electrode can be an anode or the transparent/translucent electrode can be an anode and the second electrode can be a cathode. In certain instances, the second electrode is opaque/not-transparent. The photovoltaic cell can be a bulk heterojunction photovoltaic cell or a bi-layer photovoltaic cell for example.

In another embodiment, there is disclosed an organic electronic device that includes any one of the photovoltaic cells or polymers of the present invention. Non-limiting examples of organic electronic devices include polymeric organic light-emitting diodes (PLEDs), organic integrated circuits (O-ICs), organic field effect transistors (OFETs), organic thin film transistors (OTFTs), organic solar cells (O-SCs) or organic laser diodes (O-lasers).

In still another aspect of the present invention there is disclosed a solution comprising any one of the polymers of the invention dissolved in said solution. The solvent used can be one that effectively solubilizes the polymer. Non-limiting examples of solvents include toluene, xylene, tetralin, decalin, mesitylene, n-butylbenzene, sec-butylbutylbenzene, and tert-butylbenzene; halogenated aromatic hydrocarbon-based solvents such as chlorobenzene, dichlorobenzene, and trichlorobenzene, halogenated saturated hydrocarbon-based solvents such as carbon tetrachloride, chloroform, dichloromethane, dichloroethane, chlorobutane, bromobutane, chloropentane, chlorohexane, bromohexane, and chlorocyclohexane, and ethers such as tetrahydrofuran and tetrahydropyran. The solution can be deposited by doctor blade coating, spin coating, meniscus coating, transfer printing, ink jet printing, offset printing, screen printing process, dip coating, casting, bar coating, roll coating, wire bar coating, spraying, screen printing, gravure printing, flexo printing, offset printing, gravure offset printing, dispenser coating, nozzle coating, capillary coating, etc.

Also disclosed are the following Embodiments 1 to 39 of the present invention. Embodiment 1 is a polymer having a structure of:

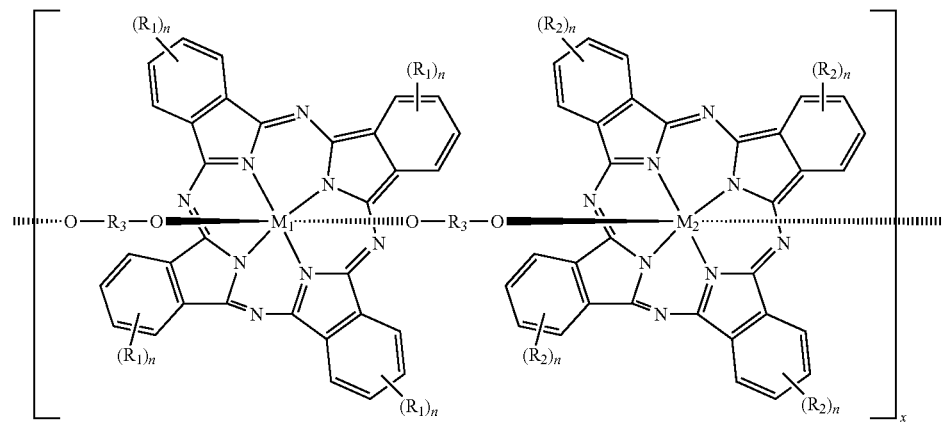

wherein $M_1$ and $M_2$ are each independently silicon, germanium, or tin; $(R_1)_n$ and $(R_2)_n$ are each independently a hydrocarbon, a hydrogen, or a halogen and n is an integer from 1 to 4; $R_3$ is an aryl group or a carbonate group; and x is an integer from 1 to 1000. Embodiment 2 is the polymer of Embodiment 1, wherein at least one of $M_1$ and $M_2$ are germanium or tin. Embodiment 3 is the polymer of Embodiment 2, wherein $M_1$ is silicon and $M_2$ is germanium. Embodiment 4 is the polymer of Embodiment 1, wherein the aryl group includes 6 to 84 carbon atoms, or 6 to 24 carbon atoms, or 6 to 18 carbon atoms. Embodiment 5 is the polymer of Embodiment 4, wherein the $R_3$ aryl group includes a non-carbon ring atom, wherein the non-carbon ring atom is a halogen, oxygen, sulfur or nitrogen. Embodiment 6 is the polymer of any one of Embodiments 1 to 5, wherein the $R_3$ aryl group is a bisphenol. Embodiment 7 is the polymer of Embodiment 6, wherein the bisphenol is m-$(C_6H_4)$—$C(CH_3)_2$—$C_6H_4$—$C(CH_3)_2$-m-$(C_6H_4)$—. Embodiment 8 is the polymer of any one of Embodiments 1 to 7, wherein $(R_1)_n$ is a substituted or un-substituted hydrocarbon. Embodiment 9 is the polymer of Embodiment 8, wherein the hydrocarbon is a methyl, ethyl, propyl, isopropyl, n-butyl, sec-butyl or tert-butyl group. Embodiment 10 is the polymer of any one of Embodiments 1 to 7, wherein $(R_1)_n$ is a halogen and n is 1. Embodiment 11 is the polymer of Embodiment 10, wherein the halogen is F, Cl, Br, or I. Embodiment 12 is the polymer of any one of Embodiments 1 to 7, wherein $(R_1)_n$ is a hydrogen and n is 1. Embodiment 13 is the polymer of any one of Embodiments 8 to 12, wherein $(R_2)_n$ is a substituted or un-substituted hydrocarbon. Embodiment 14 is the polymer of Embodiment 13, wherein the hydrocarbon is a methyl, ethyl, propyl, isopropyl, n-butyl, sec-butyl or tert-butyl group. Embodiment 15 is the polymer of any one of Embodiments 8 to 12, wherein $(R_2)_n$ is a halogen and n is 1. Embodiment 16 is the polymer of Embodiment 15, wherein the halogen is F, Cl, Br, or I. Embodiment 17 is the polymer of any one of Embodiments 8 to 12, wherein $(R_2)_n$ is a hydrogen and n is 1. Embodiment 18 is the polymer of any one of Embodiments 1 to 17, wherein the polymer has the following structure:

wherein $Y_1$ and $Y_2$ are each independently

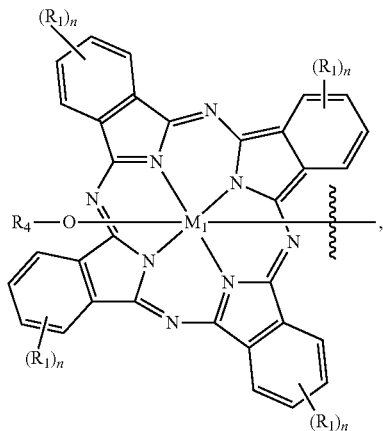

and $R_4$ is an aryl group. Embodiment 19 is the polymer of Embodiment 18, wherein the $R_4$ aryl group includes 6 to 22 carbon atoms, or 6 to 18 carbon atoms, or 6 to 10 carbon atoms. Embodiment 20 is the polymer of Embodiment 19, wherein the $R_4$ aryl group includes a non-carbon ring atom, wherein the non-carbon ring atom is a halogen, oxygen, sulfur or nitrogen. Embodiment 21 is the polymer of Embodiment 19, wherein the $R_4$ aryl group is p-$(C_6H_4)$—$C(CH_3)_3$. Embodiment 22 is the polymer of Embodiment 18, wherein: $M_1$ is germanium, $M_2$ is silicon, $R_1$ and $R_2$ are each H and n is 1, $R_3$ is m-$(C_6H_4)$—$C(CH_3)_2$—$C_6H_4$—$C(CH_3)_2$-m-$(C_6H_4)$— and $R_4$ is p-$(C_6H_4)$—$C(CH_3)_3$. Embodiment 23 is the polymer of any one of Embodiments 1 to 22, wherein the polymer is the reaction product of

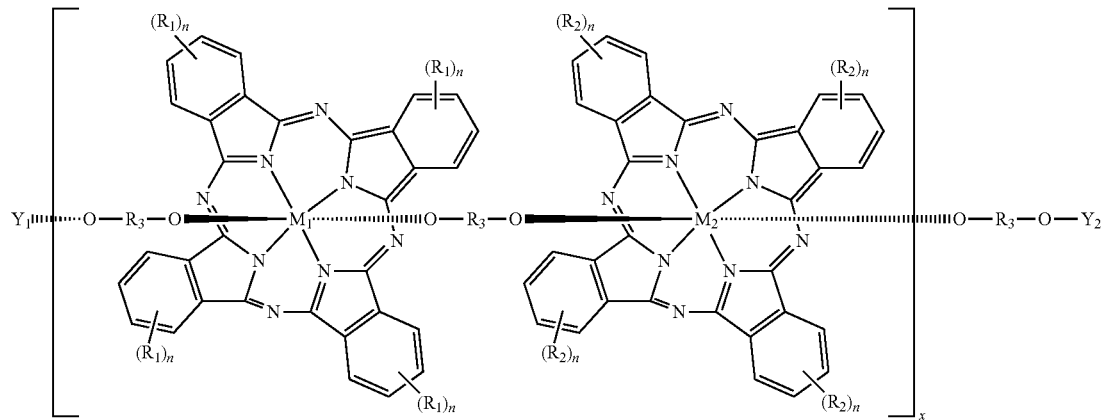

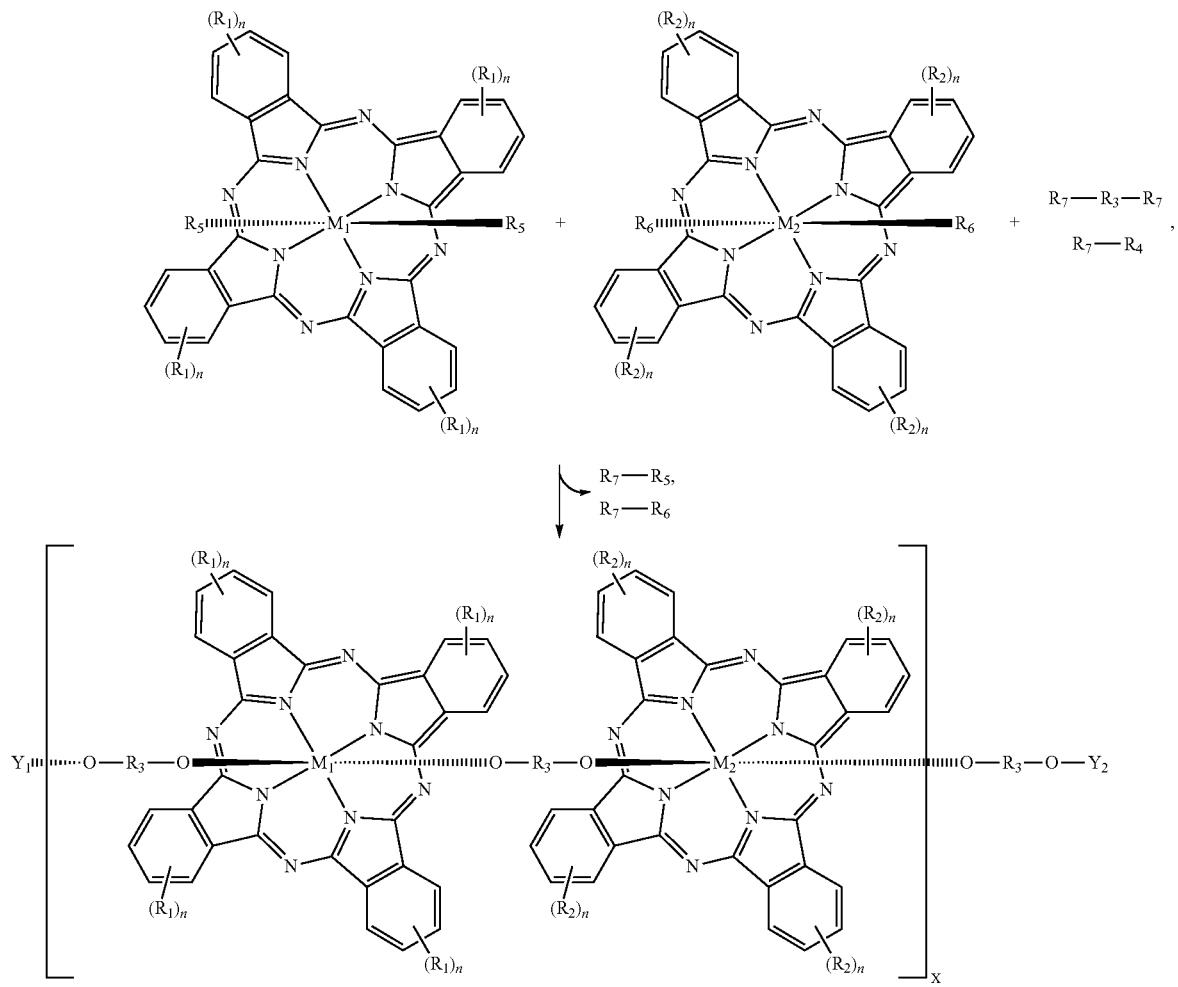

wherein $R_5$, $R_6$, and $R_7$ are each independently a halogen or a hydroxyl group. Embodiment 24 is the polymer of Embodiment 23, wherein: $M_1$ and $M_2$ are each silicon, $R_1$ and $R_2$ are each H and n is 1, $R_3$ is $C_6H_4$, $R_4$ is $C_6H_5$, and $R_5$ and $R_6$, are each a hydroxyl group, and $R_7$ is Cl. Embodiment 25 is the polymer of Embodiment 23, wherein: $M_1$ and $M_2$ are each germanium, $R_1$ and $R_2$ are each H and n is 1, $R_3$ is $C_6H_4$, $R_4$ is $C_6H_5$, and $R_5$ and $R_6$, are each a hydroxyl group, and $R_7$ is a hydroxyl group. Embodiment 26 is the polymer of any one of Embodiments 1 to 25, wherein the polymer is a semiconductive polymer. Embodiment 27 is the polymer of Embodiment 26, wherein the polymer is modified with a dopant so as to enhance its p-type or n-type properties. Embodiment 28 is a photovoltaic cell comprising photoactive layer comprising a polymer of any one of Embodiments 1 to 27. Embodiment 29 is the photovoltaic cell of Embodiment 28, comprising a transparent substrate, a transparent electrode, the photoactive layer, and a second electrode, wherein the photoactive layer is disposed between the transparent electrode and the second electrode. Embodiment 30 is the photovoltaic cell of Embodiment 29, wherein the transparent electrode is a cathode and the second electrode is an anode. Embodiment 31 is the photovoltaic cell of Embodiment 29, wherein the transparent electrode is an anode and the second electrode is a cathode. Embodiment 32 is the photovoltaic cell of any one Embodiments 28 to 31, wherein the second electrode is not transparent. Embodiment 33 is the photovoltaic cell of any one of Embodiments 28 to 32, wherein photovoltaic cell is a bulk heterojunction photovoltaic cell. Embodiment 34 is the photovoltaic cell of any one of Embodiments 28 to 32, wherein photovoltaic cell is a bi-layer photovoltaic cell. Embodiment 35 is the photovoltaic cell of any one of Embodiments 28 to 34, wherein the photovoltaic cell is comprised in an organic electronic device. Embodiment 36 is the photovoltaic cell of Embodiment 35, wherein the organic electronic device is a polymeric organic light-emitting diode (PLED), an organic integrated circuit (O-IC), an organic field effect transistor (OFET), an organic thin film transistor (OTFT), an organic solar cell (O-SC) or an organic laser diode (O-laser). Embodiment 37 is a solution comprising any one of the polymers of Embodiments 1 to 27, wherein the polymer is dissolved in said solution. Embodiment 38 is a process for making a photoactive layer on a substrate, wherein the photoactive layer comprises any one of the polymers of Embodiments 1 to 27, the process comprising disposing the solution of Embodiment 36 on the substrate and drying said solution to form the photoactive layer. Embodiment 39 is the process of Embodiment 38, wherein the solution is disposed on the substrate layer by a doctor blade coating, spin coating, meniscus coating, transfer printing, ink jet printing, offset printing or screen printing process.

The term "about" or "approximately" are defined as being close to as understood by one of ordinary skill in the art, and in one non-limiting embodiment the terms are defined to be within 10%, preferably within 5%, more preferably within 1%, and most preferably within 0.5%.

The use of the word "a" or "an" when used in conjunction with the term "comprising" in the claims or the specification may mean "one," but it is also consistent with the meaning of "one or more," "at least one," and "one or more than one."

The words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The polymers, photoactive layers, photovoltaic cells, and organic electronic devices of the present invention can "comprise," "consist essentially of," or "consist of" particular ingredients, components, compositions, etc. disclosed throughout the specification. With respect to the transitional phase "consisting essentially of," in one non-limiting aspect, a basic and novel characteristic of the polymers of the present invention are their semi-conductive properties.

Other objects, features and advantages of the present invention will become apparent from the following figures, detailed description, and examples. It should be understood, however, that the figures, detailed description, and examples, while indicating specific embodiments of the invention, are given by way of illustration only and are not meant to be limiting. Additionally, it is contemplated that changes and modifications within the spirit and scope of the invention will become apparent to those skilled in the art from this detailed description.

BRIEF DESCRIPTION OF THE DRAWINGS

FIG. 1: Illustration of an organic photovoltaic cell incorporating the polymers of the present invention.

DETAILED DESCRIPTION OF THE INVENTION

Organic materials haven been used as semiconductors in organic photovoltaic cells. One of the issues with these materials has been that they suffer from low charge carrier mobility (electrical conduction).

A new semiconductor polymer has been discovered that addresses the drawbacks from current organic materials that are used in photovoltaic cells. These and other non-limiting aspects of the present invention are discussed in further detail in the following sections.

A. Semiconductor Polymers

The semi-conductive polymers of the present invention are based on repeating monomeric units of phthalocyanines. The general structure of an substituted phthalocyanines is:

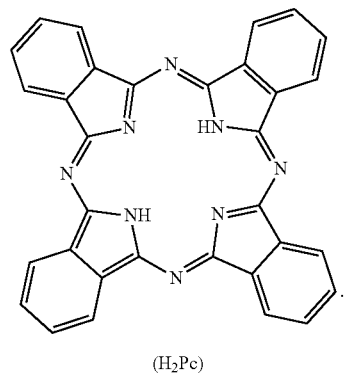

(H$_2$Pc)

As noted above, the incorporation of a group IV metal into a phthalocyanine allows for the production of a monomeric unit that can be used to efficiently produce semi-conductive polymers. In particular, the group IV metal includes at least two axial bonds that can be coupled to bifunctional spacers to form said monomeric units. The following are examples non-limiting monomeric units that can be used in the context of the present invention:

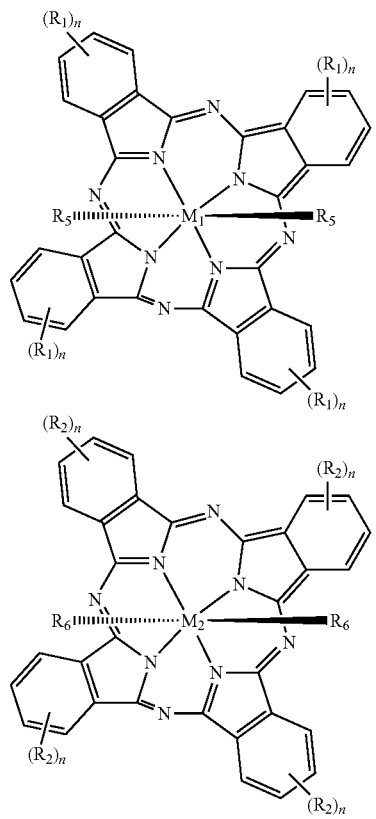

wherein, $M_1$ and $M_2$ are each independently silicon, germanium, or tin, $(R_1)_n$ and $(R_2)_n$ are each independently a hydrocarbon, a hydrogen, or a halogen and n is an integer from 1 to 4, and $R_5$ and $R_6$, are each independently a halogen or a hydroxyl group.

The following is a reaction scheme that can be used to prepare the semi-conductive polymers of the present invention:

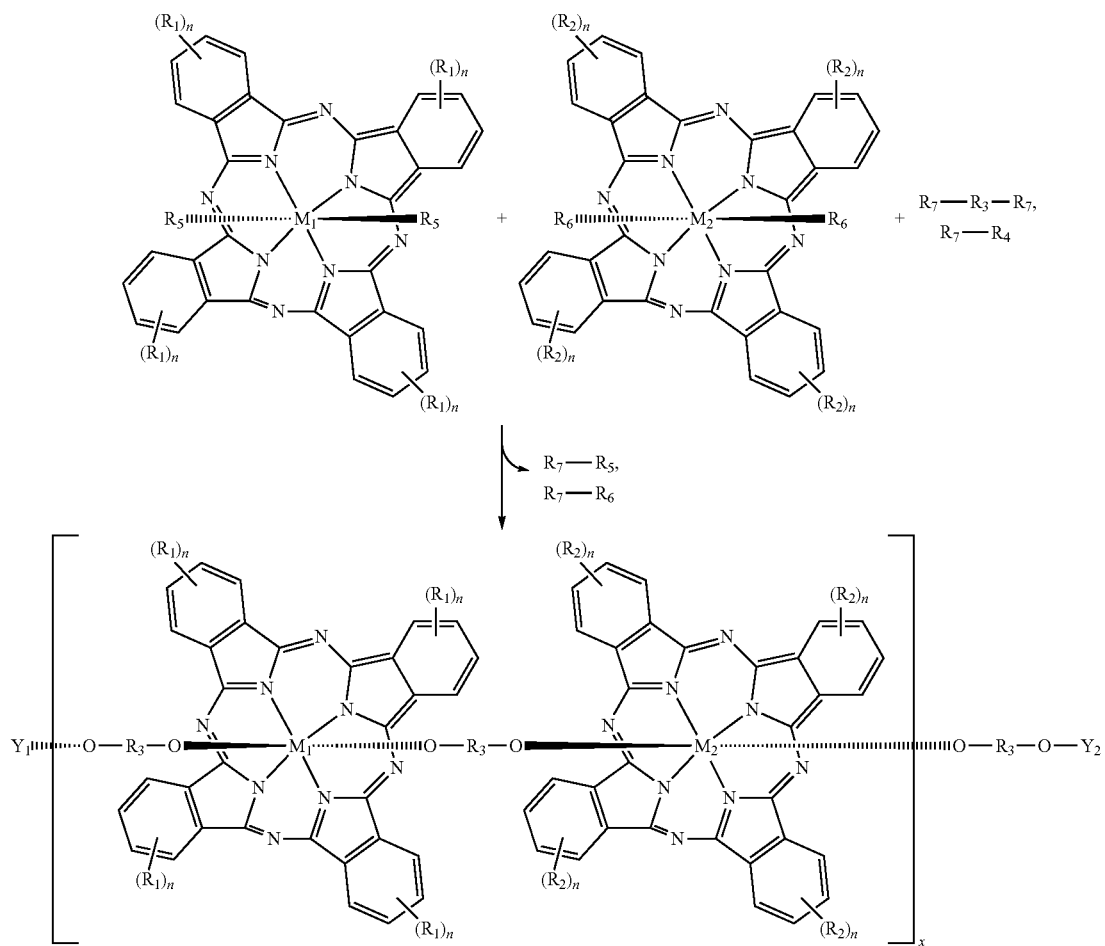

x is an integer from 1 to 10000, $R_3$ is an aryl group or a carbonate group or polymers of said groups, $R_7$ is a halogen or a hydroxyl group, and $Y_1$ and $Y_2$ are each independently:

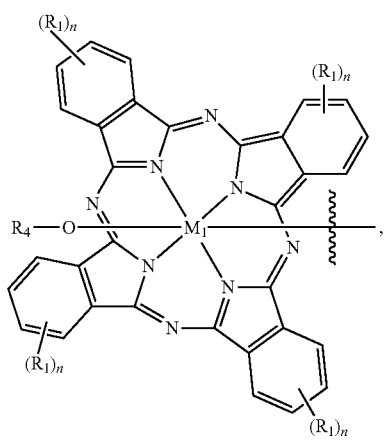

and
$R_4$ is an aryl group.

Non-limiting examples of aryl groups include bisphenols. Examples of bisphenols that can be used in the context of the present invention include:

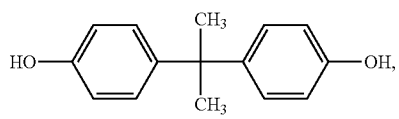

(bisphenol A)

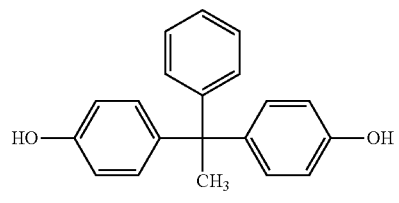

(bisphenol AP)

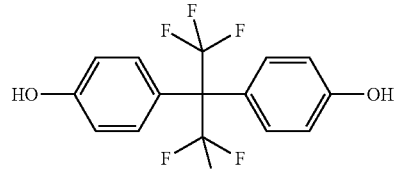

(bisphenol AF)

-continued
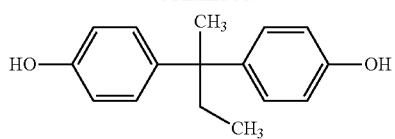
(bisphenol B)
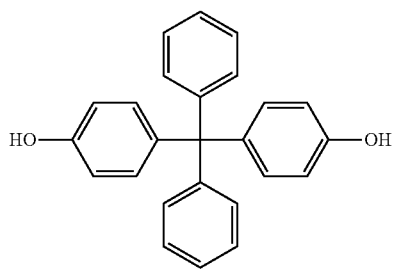
(bisphenol BP)
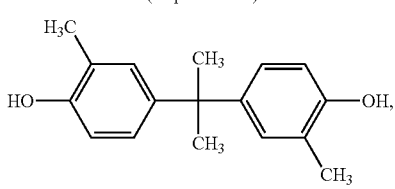
(bisphenol C)
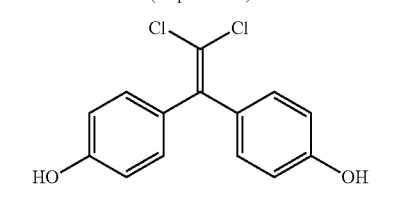
(bisphenol C II)
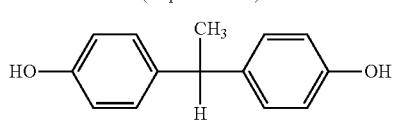
(bisphenol E)
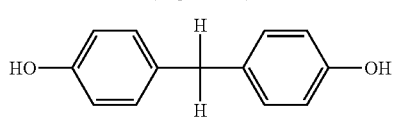
(bisphenol F)
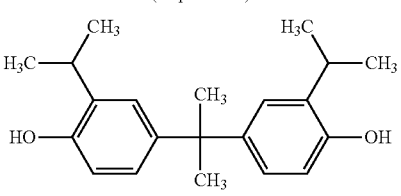
(bisphenol G)
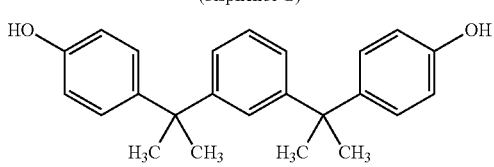
(bisphenol M)
-continued
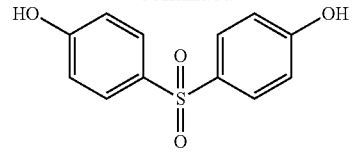
(bisphenol S)
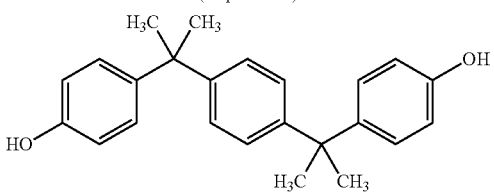
(bisphenol P)
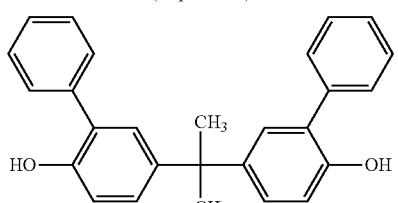
(bisphenol PH)
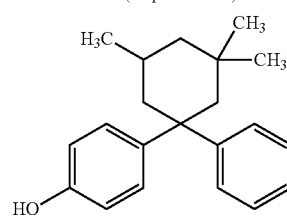
(bisphenol TMC)
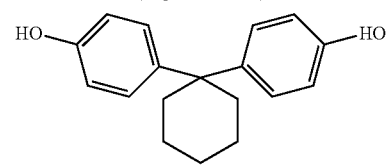
(bisphenol Z)
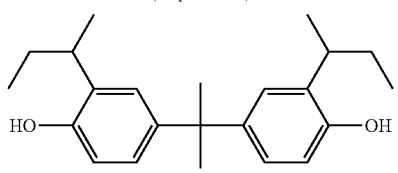
(2,2-Bis(4-hydroxy-3-sec-butylphenyl)propane)
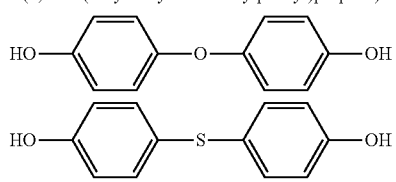
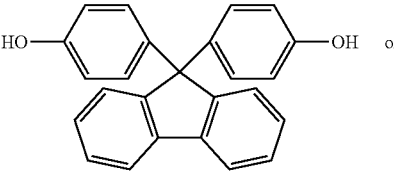 or

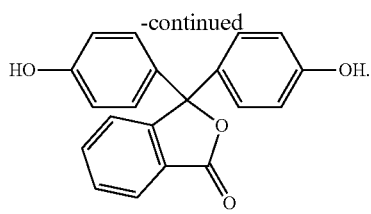

B. Organic Photovoltaic Cells

The semi-conductive polymers of the present invention can be used in organic photovoltaic cells. FIG. 1 is a cross-sectional view of a non-limiting organic photovoltaic cell that the polymers of the present invention can be incorporated into. The organic photovoltaic cell (1) can include a transparent substrate (10), a front electrode (11), a photoactive layer (12), and a back electrode (13). Additional materials, layers, and coatings (not shown) known to those of ordinary skill in the art can be used with photovoltaic cell (1), some of which are described below.

Generally speaking, the organic photovoltaic cell (1) can convert light into usable energy by: (a) photon absorption to produce excitons; (b) exciton diffusion; (c) charge transfer; and (d) charge-transportation to the electrodes. With respect to (a), the excitons are produced by photon absorption by the photoactive layer (12), which can be a mixture of p-type and n-type organic semiconductor materials (e.g., bulk heterojunction) or which can be separate p-type and n-type layers adjacent to one another (i.e., bi-layer heterojunction). For (b), the generated excitons diffuse to the p-n junction. Then in (c), the excitons separate into electrons and holes. For (d), electrons and holes are transported to the electrodes (11) and (13) and are used in a circuit.

1. Substrate (10)

The substrate (10) can be used as support. For organic photovoltaic cells, it is typically transparent or translucent, which allows light to efficiently enter the cell. It is typically made from material that is not easily altered or degraded by heat or organic solvents, and as already noted, has excellent optical transparency. Non-limiting examples of such materials include inorganic materials such as alkali-free glass and quartz glass, polymers such as polyethylene, PET, PEN, polyimide, polyamide, polyamidoimide, liquid crystal polymer, and cycloolefin polymer, silicon, and metal.

2. Front Electrode and Back Electrodes (11) and (13)

The front electrode (11) can be used as a cathode or anode depending on the set-up of the circuit. It is stacked on the substrate (10). The front electrode (11) is made of a transparent or translucent conductive material. Typically, the front electrode (11) is obtained by forming a film using such a material (e.g., vacuum deposition, sputtering, ion-plating, plating, coating, etc.). Non-limiting examples of transparent or translucent conductive material include metal oxide films, metal films, and conductive polymers. Non-limiting examples of metal oxides that can be used to form a film include indium oxide, zinc oxide, tin oxide, and their complexes such as indium stannate (ITO), fluorine-doped tin oxide (FTO), and indium zinc oxide films. Non-limiting examples of metals that can be used to form a film include gold, platinum, silver, and copper. Non-limiting examples of conductive polymers include polyaniline and polythiophene. The thickness of the film for the front electrode (11) is typically between from 30 to 300 nm. If the film thickness is less than 30 nm, then the conductivity can be reduced and the resistance increased, which results in a decrease in photoelectric conversion efficiency. If the film thickness is greater than 300 nm, then light transmittance may be lowered. Also, the sheet resistance of the front electrode (11) is typically 10Ω/□ or less. Further, the front electrode (11) may be a single layer or laminated layers formed of materials each having a different work function.

The back electrode (13) can be used as a cathode or anode depending on the set-up of the circuit. This electrode (13) can be stacked on the photoactive layer (12). The material used for the back electrode (13) is conductive. Non-limiting examples of such materials include metals, metal oxides, and conductive polymers (e.g., polyaniline, polythiophene, etc.) such as those discussed above in the context of the front electrode (11). When the front electrode (11) is formed using a material having high work function, then the back electrode (13) can be made of material having a low work function. Non-limiting examples of materials having a low work function include Li, In, Al, Ca, Mg, Sm, Tb, Yb, Zr, Na, K, Rb, Cs, Ba, and the alloys thereof. The back electrode (13) can be a single layer or laminated layers formed of materials each having a different work function. Further, it may be an alloy of one or more of the materials having a low work function and at least one selected from the group consisting of gold, silver, platinum, copper, manganese, titanium, cobalt, nickel, tungsten, and tin. Examples of the alloy include a lithium-aluminum alloy, a lithium-magnesium alloy, a lithium-indium alloy, a magnesium-silver alloy, a magnesium-indium alloy, a magnesium-aluminium alloy, an indium-silver alloy, and a calcium-aluminum alloy. The film thickness of the back electrode (13) can be from 1 to 1000 nm or from 10 to 500 nm. If the film thickness is too small, then the resistance can be excessively large and the generated charge may not be sufficiently transmitted to the external circuit.

In some embodiments, the front (11) and back (13) electrodes can be further coated with hole transport or electron transport layers (not shown in FIG. 1) to increase the efficiency and prevent short circuits of the organic photovoltaic cell (1). The hole transport layer and the electron transport layer can be interposed between the electrode and the photoactive layer (12). Non-limiting examples of the materials that can be used for the hole transport layer include polythiophene-based polymers such as PEDOT/PSS (poly(3,4-ethylenedioxythiophene)-poly(styrene sulfonate)) and organic conductive polymers such as polyaniline and polypyrrole. The film thickness of the hole transport layer can be from 20 to 100 nm. If the film thickness is too thin, short circuit of the electrode can occur more readily. If the film thickness is too thick, the film resistance is large and the generated electric current could be limited and optical conversion efficiency can be reduced. As for the electron transport layer, it can function by blocking holes and transporting electrons more efficiently. Non-limiting examples of the type of material that the electron transport layer can be made of include metal oxides (e.g., amorphous titanium oxide). When titanium oxide is used, the film thickness can range from 5 to 20 nm. If the film thickness is too thin, the hole blocking effect can be reduced and thus the generated excitons are deactivated before the excitons dissociate into electrons and holes. By comparison, when the film thickness is too thick, the film resistance is large, the generated electric current is limited, resulting in reduction of optical conversion efficiency.

3. Photoactive Layer (12)

The photoactive layer (12) can be interposed between the front electrode (10) and the back electrode (13). In one instance, the photoactive layer (12) can be a bulk heterojunction type layer such that the polymers of the present invention are mixed with a second semi-conductive material (e.g., a second polymer or a small molecule) and a micro phase separation occurs within said layer (12). Alternatively, the photoactive layer (12) can be a bi-layer hetero-junction type layer such that the polymers of the present invention form one layer and a second photoactive layer is adjacent thereto. In either instance, the layer (12) will include both p-type and n-type organic semiconductors, thereby allowing for the flow of electrons. Further, there can be multiple photoactive layers used for a given photovoltaic cell (e.g., 2, 3, 4, or more).

The photoactive layer can be deposited by obtaining a solution that includes a solvent and the polymers of the present invention solubilized therein. Non-limiting examples of such solvents include unsaturated hydrocarbon-based solvents such as toluene, xylene, tetralin, decalin, mesitylene, n-butylbenzene, sec-butylbutylbenzene, and tert-butylbenzene; halogenated aromatic hydrocarbon-based solvents such as chlorobenzene, dichlorobenzene, and trichlorobenzene, halogenated saturated hydrocarbon-based solvents such as carbon tetrachloride, chloroform, dichloromethane, dichloroethane, chlorobutane, bromobutane, chloropentane, chlorohexane, bromohexane, and chlorocyclohexane, and ethers such as tetrahydrofuran and tetrahydropyran. The solution can be deposited by doctor blade coating, spin coating, meniscus coating, transfer printing, ink jet printing, offset printing, screen printing process, dip coating, casting, bar coating, roll coating, wire bar coating, spraying, screen printing, gravure printing, flexo printing, offset printing, gravure offset printing, dispenser coating, nozzle coating, capillary coating, etc.

EXAMPLES

The present invention will be described in greater detail by way of specific examples. The following examples are offered for illustrative purposes only, and are not intended to limit the invention in any manner. Those of skill in the art will readily recognize a variety of noncritical parameters which can be changed or modified to yield essentially the same results.

Example 1

Synthesis of a Germanium Phtalocyanine (GePc) Containing Polymer

Germanium phthalocyanine (GePc) containing polymers were synthesized in a 25 mL three-neck round bottom glass flask equipped with a condenser, thermal well, and a magnetic Teflon stir bar. The flask was placed inside a heating mantle, and the equipment was placed on a magnetic stirrer. The dichloro germanium phthalocyanine (GePc-Cl$_2$) was sublimed prior to being used. Prior to sealing the reactor a mixture of GePc-Cl$_2$ (100 mg, 0.15 mmol), m-bisphenol (50 mg, 0.144 mmol) and 4-tertbutylpheonol (2.2 mg, 0.0152 mmol) and chlorobenzene (5 ml) were added. The polymerization target number-average molecular weight (Mn) at complete conversion was calculated to equal 20 kg mol$^{-1}$. Once sealed the mixture was bubbled with nitrogen and for 20 minutes prior to heating. The reactor was then heated to the appropriate temperature 120° C. while maintaining a nitrogen purge. The polymerization was stopped after 40 hours and then cooled to room temperature, which resulted in a crude polymer. The crude polymer was precipitated into methanol, filtered and dried in a vacuum oven overnight.

Example 2

Synthesis of a Germanium Phtalocyanine (GePc) Containing Polymer

Germanium phthalocyanine (GePc) containing polymers were synthesized in a 100 mL three-neck round bottom glass flask equipped with a condenser and a magnetic Teflon stir bar. The dichloro germanium phthalocyanine (GePc-Cl$_2$) was sublimed prior to being used. Prior to sealing the reactor a mixture of GePc-Cl$_2$ (0.765 g, 1.20 mmol), 2,2-Bis(4-hydroxy-3-sec-butylphenyl)propane (0.394 g, 1.2 mmol), potassium phosphate tribasic (K$_3$PO$_4$, 1.44 g, 6.9 mmol) and chlorobenzene (10 ml) were added. The reactor was then heated to the appropriate temperature 120° C. while maintaining a nitrogen purge. The polymerization was stopped after 40 hours and then cooled to room temperature, which resulted in a crude polymer. The crude polymer was precipitated into methanol, filtered and dried in a vacuum oven overnight.

Example 3

Synthesis of a Silicon Phtalocyanine (SiPc) Containing Polymer

Silicon phthalocyanine (SiPc) containing polymers were synthesized in a 100 mL three-neck round bottom glass flask equipped with a condenser and a magnetic Teflon stir bar. The dichloro germanium phthalocyanine (SiPc-Cl$_2$) was sublimed prior to being used. Prior to sealing the reactor a mixture of SiPc-Cl$_2$ (0.680 g, 1.20 mmol), 2,2-Bis(4-hydroxy-3-sec-butylphenyl)propane (0.394 g, 1.2 mmol), potassium phosphate tribasic (K$_3$PO$_4$, 1.44 g, 6.9 mmol) and chlorobenzene (10 ml) were added. The reactor was then heated to the appropriate temperature 120° C. while maintaining a nitrogen purge. The polymerization was stopped after 40 hours and then cooled to room temperature, which resulted in a crude polymer. The crude polymer was precipitated into methanol, filtered and dried in a vacuum oven overnight.

Example 4

Synthesis of a Silicon Phtalocyanine (SiPc) Containing Polymer

Silicon phthalocyanine (SiPc) containing polymers were synthesized in a 250 mL three-neck round bottom glass flask equipped with a condenser and a magnetic Teflon stir bar. The dichloro germanium phthalocyanine (SiPc-Cl$_2$) was sublimed prior to being used. Prior to sealing the reactor a mixture of SiPc-Cl$_2$ (0.680 g, 1.07 mmol), 2,2-Bis(4-hydroxy-3-sec-butylphenyl)propane (0.182 g, 0.54 mmol), m-bisphenol (0.186 g, 0.53 mmol), potassium carbonate (K$_2$CO$_3$, 0.59 g, 4.3 mmol) and chlorobenzene (20 ml) were added. The reactor was then heated to the appropriate temperature 120° C. while maintaining a nitrogen purge. The polymerization was stopped after 40 hours and then cooled to room temperature, which resulted in a crude polymer. The crude polymer was precipitated into methanol, filtered and dried in a vacuum oven overnight.

The invention claimed is:

1. A polymer having a structure of:

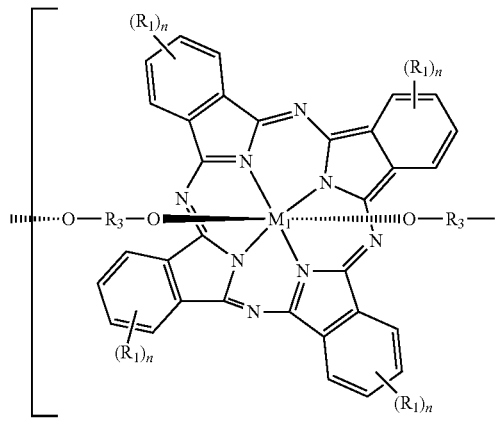

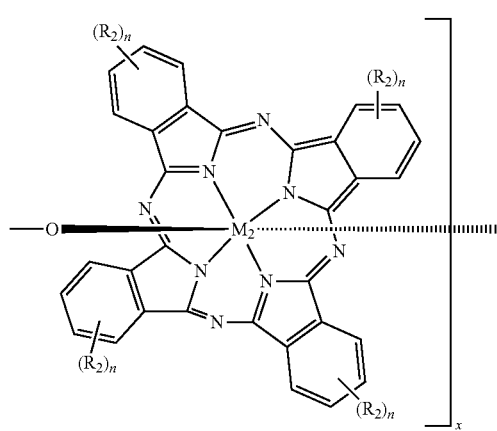

wherein
$M_1$ and $M_2$ are each independently silicon, germanium, or tin;
$(R_1)_n$ and $(R_2)_n$ are each independently a hydrocarbon, a hydrogen, or a halogen and n is an integer from 1 to 4;
$R_3$ is an aryl group or a carbonate group; and
x is an integer from 1 to 1000.

2. The polymer of claim 1, wherein at least one of $M_1$ and $M_2$ are germanium or tin.

3. The polymer of claim 2, wherein $M_1$ is silicon and $M_2$ is germanium.

4. The polymer of claim 1, wherein the aryl group includes 6 to 84 carbon atoms, or 6 to 24 carbon atoms, or 6 to 18 carbon atoms.

5. The polymer of claim 4, wherein the $R_3$ aryl group includes a non-carbon ring atom, wherein the non-carbon ring atom is a halogen, oxygen, sulfur or nitrogen.

6. The polymer of claim 1, wherein the $R_3$ aryl group is a bisphenol.

7. The polymer of claim 6, wherein the bisphenol is m-$(C_6H_4)$—$C(CH_3)_2$—$C_6H_4$—$C(CH_3)_2$-m-$(C_6H_4)$—.

8. The polymer of claim 1, wherein $(R_1)_n$ is a substituted or un-substituted hydrocarbon.

9. The polymer of claim 8, wherein the hydrocarbon is a methyl, ethyl, propyl, isopropyl, n-butyl, sec-butyl or tert-butyl group.

10. The polymer of claim 1, wherein $(R_1)_n$ is a halogen and n is 1.

11. The polymer of claim 10, wherein the halogen is F, Cl, Br, or I.

12. The polymer of claim 1, wherein $(R_1)_n$ is a hydrogen and n is 1.

13. The polymer of claim 12, wherein $(R_2)_n$ is a substituted or un-substituted hydrocarbon.

14. The polymer of claim 13, wherein the hydrocarbon is a methyl, ethyl, propyl, isopropyl, n-butyl, sec-butyl or tert-butyl group.

15. The polymer of claim 12, wherein $(R_2)_n$ is a halogen and n is 1.

16. The polymer of claim 15, wherein the halogen is F, Cl, Br, or I.

17. The polymer of claim 12, wherein $(R_2)_n$ is a hydrogen and n is 1.

18. The polymer of claim 1, wherein the polymer has the following structure:

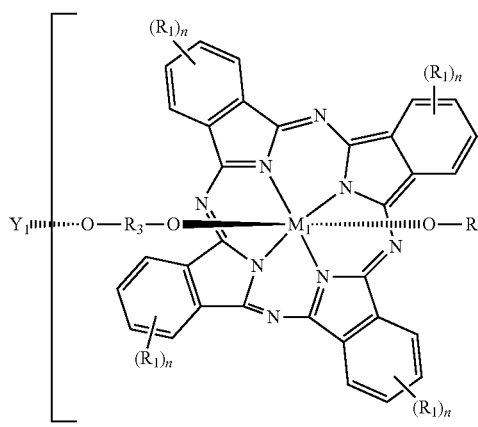
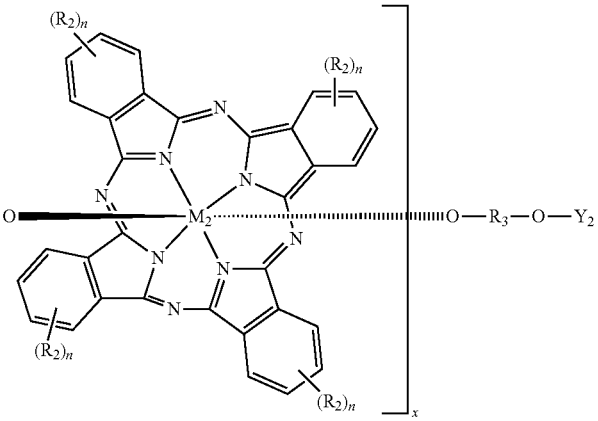

wherein $Y_1$ and $Y_2$ are each independently

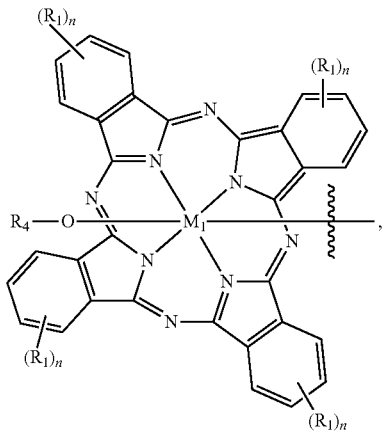

and $R_4$ is an aryl group.

19. The polymer of claim 18, wherein the $R_4$ aryl group includes 6 to 22 carbon atoms, or 6 to 18 carbon atoms, or 6 to 10 carbon atoms.

20. The polymer of claim 19, wherein the $R_4$ aryl group includes a non-carbon ring atom, wherein the non-carbon ring atom is a halogen, oxygen, sulfur or nitrogen.

21. The polymer of claim 19, wherein the $R_4$ aryl group is $p\text{-}(C_6H_4)\text{---}C(CH_3)_3$.

22. The polymer of claim 18, wherein:

$M_1$ is germanium, $M_2$ is silicon, $R_1$ and $R_2$ are each H and n is 1, $R_3$ is $m\text{-}(C_6H_4)\text{---}C(CH_3)_2\text{---}C_6H_4\text{---}C(CH_3)_2\text{-}m\text{-}(C_6H_4)\text{---}$ and $R_4$ is $p\text{-}(C_6H_4)\text{---}C(CH_3)_3$.

23. The polymer of claim 1, wherein the polymer is the reaction product of

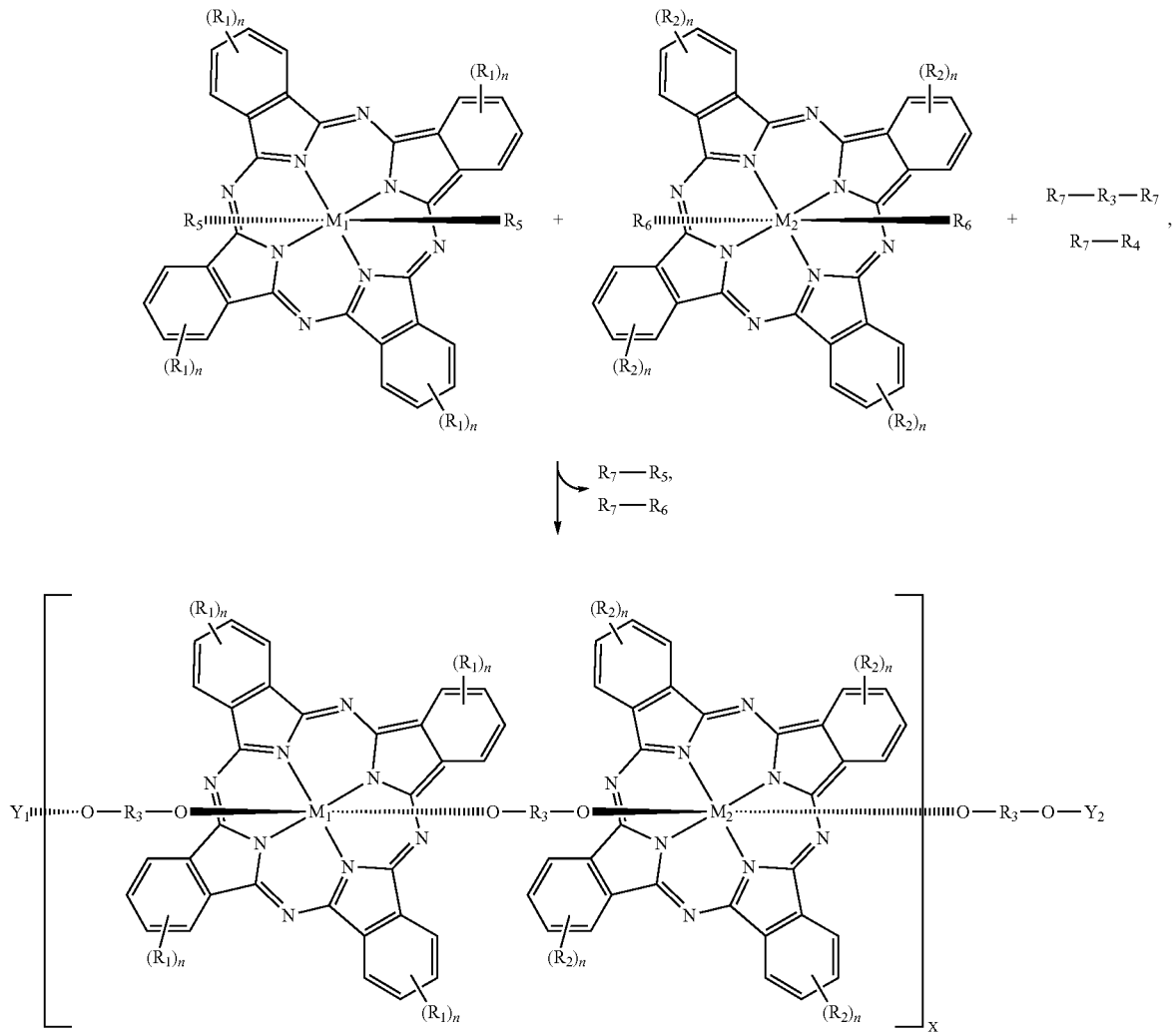

wherein $R_5$, $R_6$, and $R_7$ are each independently a halogen or a hydroxyl group.

24. The polymer of claim 23, wherein:

$M_1$ and $M_2$ are each silicon, $R_1$ and $R_2$ are each H and n is 1, $R_3$ is $C_6H_4$, $R_4$ is $C_6H_5$, and $R_5$ and $R_6$, are each a hydroxyl group, and $R_7$ is Cl.

25. The polymer of claim 23, wherein:

$M_1$ and $M_2$ are each germanium, $R_1$ and $R_2$ are each H and n is 1, $R_3$ is $C_6H_4$, $R_4$ is $C_6H_5$, and $R_5$ and $R_6$, are each a hydroxyl group, and $R_7$ is a hydroxyl group.

26. The polymer of claim 1, wherein the polymer is a semi-conductive polymer.

27. The polymer of claim 26, wherein the polymer is modified with a dopant so as to enhance its p-type or n-type properties.

28. The polymer of claim 1 comprised in a photoactive layer of a photovoltaic cell.

29. A solution comprising the polymer of claim 1, wherein the polymer is dissolved in said solution.

30. A process for making a photoactive layer on a substrate, wherein the photoactive layer comprises the polymer of claim 1, the process comprising disposing a solution of the polymer of claim 1 on the substrate and drying said solution to form the photoactive layer.

* * * * *